(12) United States Patent
Palka et al.

(10) Patent No.: US 9,033,676 B2
(45) Date of Patent: May 19, 2015

(54) METHOD AND SYSTEM FOR OPTIMIZING DOWNHOLE FLUID PRODUCTION

(71) Applicant: Pumpwell Solutions Ltd., Calgary (CA)

(72) Inventors: Krzysztof Palka, Calgary (CA); Jaroslaw A. Czyz, Calgary (CA)

(73) Assignee: Pumpwell Solutions Ltd., Calgary, Alberta (CA)

(*) Notice: Subject to any disclaimer, the term of this patent is extended or adjusted under 35 U.S.C. 154(b) by 0 days.

(21) Appl. No.: 13/757,622

(22) Filed: Feb. 1, 2013

(65) Prior Publication Data

US 2013/0151216 A1    Jun. 13, 2013

Related U.S. Application Data

(63) Continuation of application No. 12/090,250, filed as application No. PCT/CA2005/001570 on Oct. 13, 2005, now abandoned.

(51) Int. Cl.
*G06F 17/50* (2006.01)
*E21B 43/12* (2006.01)
(Continued)

(52) U.S. Cl.
CPC .......... *G06F 17/5018* (2013.01); *E21B 43/127* (2013.01); *F04B 47/02* (2013.01);
(Continued)

(58) Field of Classification Search
CPC ...... F04B 47/022; F04B 49/065; F04B 49/20; F04B 2201/0202; F04B 2201/0206; F04B 2201/121; F04B 47/02; F04B 2205/04; F04B 2203/0209; E21B 43/126; E21B 2043/125; E21B 41/0092; E21B 43/127; G06F 17/5018; G05B 13/041

USPC ............... 417/44.1, 44.2, 43, 12, 212
See application file for complete search history.

(56) References Cited

U.S. PATENT DOCUMENTS 3,075,466 A    1/1963    Agnew et al.
3,343,409 A    9/1967    Gibbs
(Continued)

FOREIGN PATENT DOCUMENTS

CA    1164271    3/1984
CA    2018119    12/1991
(Continued)

OTHER PUBLICATIONS

Power Savings and Load Reductions on Sucker Rod Pumping Wells, by Neely et al., published 1989.*
(Continued)

*Primary Examiner* — Devon Kramer
*Assistant Examiner* — Thomas Fink
(74) *Attorney, Agent, or Firm* — Klarquist Sparkman, LLP

(57) ABSTRACT

A method and system for pumping unit with an elastic rod system is applied to maximize fluid production. The maximum stroke of the pump and the shortest cycle time are calculated based on all static and dynamic properties of downhole and surface components without a limitation to angular speed of the prime mover. Limitations of structural and fatigue strength are incorporated into the optimization calculation to ensure safe operation while maximizing pumped volume and minimizing energy consumption. Calculated optimal prime mover speed is applied to the sucker rod pump by means of beam pumping, long stroke or hydraulic pumping unit by controlling velocity, acceleration and torque of the electric prime mover or by controlling pressure and flow rate in hydraulically actuated sucker rod pumping system.

23 Claims, 5 Drawing Sheets

(51) Int. Cl.
*F04B 47/02* (2006.01)
*F04B 49/06* (2006.01)
*G05B 13/04* (2006.01)

(52) U.S. Cl.
CPC ............ *F04B 47/022* (2013.01); *F04B 49/065* (2013.01); *F04B 2201/0202* (2013.01); *F04B 2201/0206* (2013.01); *F04B 2201/121* (2013.01); *F04B 2203/0209* (2013.01); *F04B 2205/04* (2013.01); *G05B 13/041* (2013.01)

(56) References Cited

U.S. PATENT DOCUMENTS

| | | | |
|---|---|---|---|
| 3,851,995 A | 12/1974 | Mills et al. |
| 3,854,846 A | 12/1974 | Douglas |
| 3,915,225 A | 10/1975 | Swink |
| 3,918,843 A | 11/1975 | Douglas et al. |
| 3,930,752 A | 1/1976 | Douglas |
| 3,936,231 A | 2/1976 | Douglas |
| 3,938,910 A | 2/1976 | Douglas |
| 3,951,209 A | 4/1976 | Gibbs |
| 3,963,374 A | 6/1976 | Sullivan |
| 3,965,983 A | 6/1976 | Watson |
| 3,998,568 A | 12/1976 | Hynd |
| 4,058,757 A | 11/1977 | Welton et al. |
| 4,090,405 A | 5/1978 | McKee |
| 4,102,394 A | 7/1978 | Botts |
| 4,118,148 A | 10/1978 | Allen |
| 4,145,161 A | 3/1979 | Skinner |
| 4,171,185 A | 10/1979 | Duke et al. |
| 4,194,393 A | 3/1980 | Boley |
| 4,220,440 A | 9/1980 | Taylor et al. |
| 4,286,925 A | 9/1981 | Standish |
| 4,363,605 A | 12/1982 | Mills |
| 4,390,321 A | 6/1983 | Langlois et al. |
| 4,406,122 A | 9/1983 | McDuffie |
| 4,438,628 A | 3/1984 | Creamer |
| 4,474,002 A | 10/1984 | Perry |
| 4,476,418 A | 10/1984 | Werner |
| 4,480,960 A | 11/1984 | Streib |
| 4,483,188 A | 11/1984 | McTamaney et al. |
| 4,487,061 A | 12/1984 | McTamaney et al. |
| 4,490,094 A | 12/1984 | Gibbs |
| 4,507,055 A | 3/1985 | Fair et al. |
| 4,508,487 A | 4/1985 | Taylor et al. |
| 4,508,488 A | 4/1985 | Pikna |
| 4,509,901 A | 4/1985 | McTamaney et al. |
| 4,534,168 A | 8/1985 | Brantly |
| 4,534,706 A | 8/1985 | Palm et al. |
| 4,541,274 A | 9/1985 | Purcupile |
| 4,583,915 A | 4/1986 | Montgomery et al. |
| 4,594,665 A | 6/1986 | Chandra et al. |
| 4,599,046 A | 7/1986 | James |
| 4,631,954 A | 12/1986 | Mills |
| 4,661,751 A | 4/1987 | Werner |
| 4,681,167 A | 7/1987 | Soderberg |
| 4,691,511 A * | 9/1987 | Dollison ........................ 60/414 |
| 4,695,779 A | 9/1987 | Yates |
| 4,741,397 A | 5/1988 | Weeks |
| 4,747,451 A | 5/1988 | Adams, Jr. et al. |
| 4,830,112 A | 5/1989 | Erickson |
| 4,854,164 A | 8/1989 | Rhoads |
| 4,859,151 A | 8/1989 | Reed |
| 4,873,635 A | 10/1989 | Mills |
| 4,935,685 A | 6/1990 | Justus et al. |
| 4,971,522 A | 11/1990 | Butlin |
| 4,973,226 A | 11/1990 | McKee |
| 5,006,044 A | 4/1991 | Walker, Sr. et al. |
| 5,044,888 A | 9/1991 | Hester, II |
| 5,064,349 A | 11/1991 | Turner et al. |
| 5,129,264 A | 7/1992 | Lorenc |
| 5,129,267 A | 7/1992 | Nicholls |
| 5,167,490 A | 12/1992 | McKee et al. |
| 5,180,289 A | 1/1993 | Wenholz et al. |
| 5,182,946 A | 2/1993 | Boughner et al. |
| 5,204,595 A | 4/1993 | Opal et al. |
| 5,222,867 A | 6/1993 | Walker, Sr. et al. |
| 5,224,834 A | 7/1993 | Westerman et al. |
| 5,230,607 A | 7/1993 | Mann |
| 5,237,863 A | 8/1993 | Dunham |
| 5,246,076 A | 9/1993 | Watson |
| 5,251,696 A | 10/1993 | Boone et al. |
| 5,252,031 A | 10/1993 | Gibbs |
| 5,281,100 A | 1/1994 | Diederich |
| 5,284,422 A | 2/1994 | Turner et al. |
| 5,316,085 A | 5/1994 | Dawson |
| 5,318,409 A | 6/1994 | London et al. |
| 5,362,206 A | 11/1994 | Westerman et al. |
| 5,372,482 A | 12/1994 | London et al. |
| 5,425,623 A | 6/1995 | London et al. |
| 5,441,389 A | 8/1995 | Wolcott et al. |
| 5,444,609 A | 8/1995 | Swamy et al. |
| 5,458,466 A | 10/1995 | Mills |
| 5,589,633 A | 12/1996 | McCoy et al. |
| 5,634,522 A | 6/1997 | Hershberger |
| 5,782,608 A | 7/1998 | McKee |
| 5,819,849 A | 10/1998 | Booth |
| 5,820,350 A | 10/1998 | Mantey et al. |
| 5,823,262 A | 10/1998 | Dutton |
| 5,829,530 A | 11/1998 | Nolen |
| 5,868,029 A | 2/1999 | Paine |
| 5,941,305 A | 8/1999 | Thrasher et al. |
| 5,996,691 A | 12/1999 | Norris et al. |
| 6,041,856 A | 3/2000 | Thrasher et al. |
| 6,043,569 A | 3/2000 | Ferguson |
| 6,079,491 A | 6/2000 | Stuebinger et al. |
| 6,092,600 A | 7/2000 | McKinzie et al. |
| 6,127,743 A | 10/2000 | Levin et al. |
| 6,129,110 A | 10/2000 | Kolb |
| 6,155,347 A | 12/2000 | Mills |
| 6,176,682 B1 | 1/2001 | Mills |
| 6,213,722 B1 | 4/2001 | Raos |
| 6,285,014 B1 | 9/2001 | Beck et al. |
| 6,315,523 B1 | 11/2001 | Mills |
| 6,343,656 B1 * | 2/2002 | Vazquez et al. ................ 166/373 |
| 6,464,464 B2 | 10/2002 | Sabini et al. |
| 6,585,041 B2 | 7/2003 | Crossley |
| 6,629,570 B1 | 10/2003 | Head |
| 6,857,474 B2 | 2/2005 | Bramlett et al. |
| 6,890,156 B2 | 5/2005 | Watson et al. |
| 7,117,120 B2 | 10/2006 | Beck et al. |
| 7,168,924 B2 | 1/2007 | Beck et al. |
| 7,275,025 B2 | 9/2007 | Chan et al. |
| 2002/0123870 A1 | 9/2002 | Chan et al. |
| 2004/0062657 A1 | 4/2004 | Beck et al. |
| 2004/0062658 A1 | 4/2004 | Beck et al. |
| 2004/0064292 A1 | 4/2004 | Beck et al. |
| 2004/0084179 A1 * | 5/2004 | Watson et al. ........... 166/250.15 |
| 2005/0095140 A1 | 5/2005 | Boren et al. |

FOREIGN PATENT DOCUMENTS

| | | |
|---|---|---|
| CA | 2271525 | 11/1999 |
| CA | 2332228 | 10/2001 |
| CA | 2469059 | 6/2003 |
| CA | 2443175 | 3/2004 |
| CA | 2614817 | 3/2004 |
| CA | 2644149 | 3/2004 |
| CA | 2414646 | 5/2004 |
| CA | 2551257 | 12/2006 |
| CA | 2443010 | 2/2008 |
| CA | 2442973 | 1/2009 |
| WO | WO 93/02289 | 2/1993 |
| WO | WO 03/048578 | 6/2003 |

OTHER PUBLICATIONS

Sucker Rod Pumping Manual, by Gabor Takacs, published 2003, PenWell Corporation.*
"ABB Introduces First Complete Line of Standard Controllers for Artificial Lifts," ABB Inc. (Jan. 15, 2003).
Archived Unico webpages, web.archive.org/web/20001102062836/www.unicous.com/html/oil.html (13 pages), web.archive.org/web/20011220124901/www.unicous.com/html/oilproduction.html (3

(56) References Cited

OTHER PUBLICATIONS pages), web.archive.org/web/20021103040140/unicous.com/html/oilproduction.html (3 pages), Unico Inc. (2001-2002).
"Artificial Lift Control" ABB Inc. Brochure (2002).
Campbell, "Lift Technology Stays Ahead of Game," The American Oil & Gas Reporter (Jun. 2003).
Carroll, "Multivariate Production Systems Optimization," Stanford University, Report in Partial Fulfillment of Masters of Science, (Dec. 1990).
Czyz and Lukasiewicz, "Multimodal Optimization of Structures with Frequency Constraints," *AIAA Journal*, 33(8):1496-1502, (Aug. 1995).
Denney, "Technology Applications," JPT (Mar. 2003).
Firu, et al., SPE 84139, "A Modern Approach to the Optimum Design of Sucker-Rod Pumping System," *Society of Petroleum Engineers*, presented at the SPE Annual Technical Conference and Exhibition, Denver, Colorado, Oct. 5-8, 2003, pp. 1-9.
Gladd, "ABB Brakes Ground in Artificial Lifts with New Generation of Rod Pump Control Technology; Controller Achieves Dramatic Increases in Well Efficiency, Production and Rod-Stress Reduction," ABB Inc. (2003).
Guffey et al., "Field testing of Variable-Speed Beam-Pump Computer Control," *SPE Production Engineering*, pp. 155-160, (May 1991).
Han, et al., SPE 29535, "An Approach to the Optimum Design of Sucker-Rod Pumping Systems," *Society of Petroleum Engineers*, presented at the Production Operations Symposium, Oklahoma City, Apr. 2-4, 1995, pp. 855-865.
Lea et al.,"What's New in Artificial Lift: Part 1: Fourteen New Systems for Beam, Progressing-cavity, Plunger-lift Pumping and Gas Lift," World Oil (Apr. 2002).
David G. Luenberger, *Optimization by Vector Space Methods*, John Wiley & Sons, Inc., 1969, cover pages and pages vii-viii, ix-xiii, and 290-293 (13 pages).
Lukasiewicz and Hojjati, "A New Hybrid Method for Solving Linear Non-Linear Systems of Equations," *Int. J. for Num. Methods in Eng,.* 63:231-240, (Feb. 21, 2005).
Lukasiewicz and Hojjati, "Adaptive matrix filter," Proceedings of Canadian Congress of Applied Mechanics, University of Calgary, pp. 394-395, (Jun. 1-5, 2003).
Lukasiewicz et al., "On Adaptive Modeling and Filtering in Computer Simulation and Experimental Mechanics," *Bulletin of the Polish Academy of Sciences Technical Sciences*, 55(1):99-106, (2007).
Lukasiewicz, "A New Algorithm for Adaptive Modeling of Mechanical Systems," Fourth International ICSC Symposium on Engineering of Intelligent Systems EIS 2004, University of Madeira, Funchal, Portugal, Feb. 29th-Mar. 2nd, 2004. The publication date is confirmed in the MME MORANDA, Mechanical and Manufacturing Engineering University of Calgary, vol. 3, No. 8, (Nov. 2004).
Nocedal and Wright, *Numerical Optimization*, Springer Series in Operations Research, 1999, cover pages, table of contents, Chapter 1, and Chapter 15 (49 total pages).
"Oil & Gas Automation Solutions," Newsletter, Issue No. 1 (Oct. 2002).
Andrezj Osyczka, *Multicriterion Optimization in Engineering with FORTRAN Programs*, Ellis Horwood Series in Mechanical Engineering, 1984, cover pages, table of contents, preface, and pp. 1-21 (14 total pages).
Palka, Krysztof, Advisor: Lukasiewicz, S.A., University of Calgary Library Collection Listing for "Detection of Cracks and Corroded Members in Structures From Dynamic Response," (Issue Date 1996).
Ralph W. Pike, Optimization for Engineering Systems, Van Nostrand Reinhold Company, 1986, cover pages, preface, table of contents, and pages 1-5 (9 total pages).

Singiresu S. Rao, *Engineering Optimization, Theory and Practice*, Third Edition, John Wiley & Sons, Inc., 1996, cover pages, preface, table of contents, and pp. 1-9 (14 total pages).
Ravindran and Home, "Multivariate Optimization of Production Systems—The Time Dimension," Stanford University Petroleum Research Institute, (Apr. 1993).
A. Ravindran & G. V. Reklaitis, Chapter 17, Design Optimization—An Overview in *Mechanical Engineers' Handbook*, $2^{nd}$ Ed. John Wiley & Sons, Inc., 1998, pp. 353-375.
Reklaitis et al., *Engineering Optimization, Methods and Applications*, John Wiley & Sons, Inc., 1983, cover pages, preface, table of contents, and pp. 1-23 and 562-563, (21 total pages).
SR Pump User Manual, S.A.L. Engineering and Software Ltd. (1989/1995).
Svinos, "Exact Kinematic Analysis of Pumping Units," *Society of Petroleum Engineers (SPE 12201)*, $58^{th}$ Annual Technical Conference and Exhibition, San Francisco, CA, (Oct. 5-8, 1983).
Takacs, "Modern Sucker-Rod Pumping," Petroleum Engineering Dept., Univ. of Miskolc, Hungary (Tulsa, OK: Pennwell Books) (Oct. 5, 1980).
Tackacs, "Sucker Rod Pumping Manual," Penwell Publishing; ISBN 0-87814-899-2, pp. 227-230, (2003).
"Technical Guide No. 4—Guide to Variable Speed Drives," ABB Inc. (Feb. 8, 2002).
"Sucker-Rod Pump Drive," Unico, www.unicous.com/en/literature.html (Oil and Gas—SRP Control), Oct. 2003, 4 pages.
Torseke, Eric, "ABB Breaks Ground in Artificial Lifts With New Generation of Rod Pump Control Technology; Controller Achieves Dramatic Increases in Well Efficiency, Production and Rod-stress Reduction," ABB Inc. (Mar. 6, 2003).
"Technical Note, Artificial Lift Drives," Unico, www.unicous.com/literature.html (Oil and Gas—Artificial Life Drives Brochure), Jul. 2005, 16 pages.
Wilkes, "Differential Equations of Fluid Mechanics," *Fluid Mechanics for Chemical Engineers*, Chapter 5, pp. 231-264 (1999).
Xu, "Design and Analysis of Deviated Rod-Pumped Wells," *Society of Petroleum Engineers* (SPE 64523), presentation at the SPW Asia Pacific Oil and Gas Conference and Exhibition, Brisbane AU, (Oct. 16-18, 2000).
International Search Report of the International Searching Authority, mailed Jul. 12, 2006, for corresponding International Application No. PCT/CA2005/001570.
International Preliminary Report on Patentability and Written Opinion of the International Searching Authority, mailed Jul. 12, 2006, for corresponding International Application No. PCT/CA2005/001570.
Office Action from the Canadian Intellectual Property Office, for corresponding Canadian Patent Application No. 2,526,345, dated Oct. 26, 2009.
Office Action from the Canadian Intellectual Property Office, for corresponding Canadian Patent Application No. 2,526,345, dated Mar. 17, 2010.
S. 341 Protest filed with Canadian Intellectual Property Office by Goodwin McKay, against Canadian Patent Application No. 2,526,345, dated Oct. 6, 2008, 28 pages.
S. 341 Protest filed with Canadian Intellectual Property Office by Finlayson & Singlehurtst, against Canadian Patent Application No. 2,526,345, dated Dec. 19, 2008, 49 pages.
S. 341 Protest filed with Canadian Intellectual Property Office by Goodwin McKay, against Canadian Patent Application No. 2,526,345, dated Oct. 6, 2010, 37 pages.
Affidavit of Yau Shu Wong in support of S. 341 Protest filed by Goodwin McKay against Canadian Patent Application No. 2,526,345, dated Oct. 6, 2010, 16 pages.
Affidavit of Stevan Dubljevic in support of S. 341 Protest filed by Goodwin McKay against Canadian Patent Application No. 2,526,345, dated Oct. 6, 2010, 16 pages.

* cited by examiner

METHOD AND SYSTEM FOR OPTIMIZING DOWNHOLE FLUID PRODUCTION

CROSS REFERENCE TO RELATED APPLICATIONS

This is a continuation of U.S. patent application Ser. No. 12/090,250, filed Jun. 4, 2008, which is a U.S. National Stage Application of PCT/CA2005/001570, filed Oct. 13, 2005, both of which applications are hereby incorporated by reference.

FIELD OF THE INVENTION

This invention relates to methods and systems for maximizing downhole fluid pumping using a sucker rod pumping system, and more particularly to methods and systems for maximizing fluid production by optimizing the sucker rod prime mover speed.

BACKGROUND OF THE INVENTION

Reciprocating oil pumps are traditionally operated by a beam pumping unit, as illustrated in FIG. 1 and described below, with a sinusoidal characteristic of reciprocating motion of a polished rod as dictated by the fixed speed of an electrical or gas prime mover and the geometry of the beam pumping unit. Conventionally, a constant crank speed is employed in the operation of the beam pumping unit; as a result, the geometry of the beam pumping unit dictates a rod speed which follows a curve which is sinusoidal in nature. Other types of pumping units, such as long stroke or hydraulically actuated pumping units, operate at a first constant speed of the polished rod during upstroke motion and at a second constant speed during down-stroke motion, with additional speed variability only during change of the direction of the motion. Some of the pumping units utilize variable control of prime movers to allow for easier change in fixed speed of the prime mover or the ability to choose variable speed of the prime mover in any desired portion of the pumping cycle.

A conventional sucker rod pumping system comprises surface equipment (the beam pumping unit, or pump jack), and downhole equipment (the sucker rod and pump) which operates in a well bore drilled into an oil reservoir. The interaction of the movable and stationary elements of the well and dynamic interaction with fluids present in the well creates a complicated mechanical system that requires precise design and control to be able to work in an efficient way.

In order to increase oil production, analysis and optimization of all of the elements of the sucker rod pumping system must be performed. The design of the oil well system equipment is usually performed on the basis of mechanical laws and special methods, and certain established analytical standards are required to enable development of a beneficial design and desired operation of the oil well. Such an analysis generally involves:
1. A dynamic analysis of the sucker rod system when the dynamic forces and stresses acting on the sucker rod are calculated (dynamic wave equation);
2. a kinetic analysis of the surface equipment (pumping unit);
3. analysis of the performance of the bottom-hole pump (well evaluation software); and
4. analysis of the performance of the oil reservoir (inflow performance relation).

Such a system analysis presented in the prior art can provide correct and useful information on the original design of the well and on its performance, but only for the constant speed of the prime mover. Past attempts to increase well production have incorporated changing the components of the rod string and size of the pump, changing the overall rotational velocity of the crank, varying the speed within the stroke by choosing different constant crank speeds for upstroke and down-stroke with a variable frequency drive, or by utilizing ultra high slip electric motors to slow down speed of the prime mover during peak torque periods within a single stroke. Prior art has taught allowing for speed change of the prime mover as a response to the need for controlling pump-off conditions (U.S. Pat. Nos. 4,490,094; 4,973,226; and 5,252,031; please note that U.S. Pat. No. 5,252,031 is based on calculation of the down-hole pump behaviour as originally presented in U.S. Pat. No. 3,343,409), limiting loads on the rod string connecting surface unit with reciprocating pump and other components (U.S. Pat. Nos. 4,102,394 and 5,246,076; PCT Application No. WO 03/048578), optimizing pumping conditions of the pumping unit (U.S. Pat. Nos. 4,102,394 and 4,490,094), or converting the sinusoidal speed characteristic of the polished rod powered by a beam pumping unit to a linear characteristic throughout most of the upstroke and down-stroke motion (U.S. Pat. No. 6,890,156) to mimic long stroke behaviour with a typical pump-jack unit.

Most of the prior art methods and systems are based on various analyses of loads or energy on the polished rod and indirect detection of various problems with pump performance or fluid inflow to the well. U.S. Pat. No. 4,102,394, for example, teaches setting a different constant speed for the prime mover during upstroke movement as opposed to down-stroke movement to match inflow of the oil from the reservoir and to avoid pump-off conditions. The method of U.S. Pat. No. 4,490,094 determines and modifies the instantaneous speed of the prime mover for a predetermined portion of the polished rod stroke, based on power output and work done by the prime, mover. PCT Application No. WO 03/048578 teaches the application of finite changes to the speed of the prime mover within one stroke, to limit the load acting on the polished rod within pre-established safe limits. U.S. Pat. No. 6,890,156 teaches finite changes to the speed of the prime mover so the speed of the polished rod reciprocated by the beam pumping unit remains constant for an extended period during upstroke and down-stroke periods. Speed changes are dictated by the geometry of the beam pumping unit and are resulting in shorter stroke time for the same maximum speed of the polished rod. No relation or effect on the effective stroke of the pump or impact on maximum or minimum force acting in the rod string is taken into consideration or intentionally changed.

For over a decade, various suppliers of variable frequency drives (VFD) for beam pumping provided an opportunity to change the speed of the crank and polished rod within a single stroke of the pump. Some of the drives, such as the ePAC Vector Flux Drive from eProduction Solutions or the Sucker-Rod Pump Drive from Unico, Inc., allow a user to incorporate variable speed of the crank and rod throughout a single stroke by means of an incorporated Programmable Logic Controller and industry standard ladder programming language.

In the prior art, the speed of the polished rod was altered in order to improve, but not optimize, certain aspects of pump operations, such as reducing loads in the rod string, and their teachings had focused on the kinematics of the pumping system by prescribing certain movements of the polished rod without analyzing the dynamics of the entire system, including the surface unit, rod string and downhole pump. The optimization process was limited to the design phase, where, based on the system requirements and the dynamic analysis of the entire pumping system, the physical parameters of the system (such as motor power, rod string materials and dimensions, etc.) were determined to meet the required production target and satisfy the limits on the loads on the system. However, the optimization of the design assumed a constant speed of the prime mover.

While trying to improve the design of a new pumping system or improve the operation of an existing system, there was no attempt to optimize its performance by optimizing the stroke period and the variation of the prime mover speed within a stroke. Implementing such an approach creates an opportunity to develop a method and a system that can address the highly nonlinear nature of the problem of oil production optimization, while at the same time reducing operating costs and providing for operation with safe loading factors.

SUMMARY OF THE INVENTION

The present invention seeks to provide a method and system for optimizing the sucker-rod pump prime mover speed in order to maximize oil production while at the same time reducing operating costs and providing for operation with safe loading factors. The optimization can be performed for existing pumping systems as well as during the design phase of a new system. The presented optimization process and system focuses on finding and applying the optimal variable speed of the prime mover; however, the resulting optimal prime mover angular speed determines the optimal polished rod linear velocity, therefore—after minor modifications within the competence of a person skilled in the relevant art—the present method can also be applied to optimization of the polished rod velocity instead of the prime mover angular speed.

The present invention also seeks to provide the ability to automatically monitor, analyze, test, optimize, control, and manage a given well from a remote central location. The proposed system performs kinetic and dynamic analysis of the oil well equipment, and using various experimental data and Mathematical modeling is able to optimize the well performance. Additional benefits include monitoring the pumping conditions and detecting unusual, deteriorating or detrimental operating conditions, and changing the pumping parameters in response to the detected changes.

According to a first aspect of the present invention, there is provided a method for controlling prime mover angular velocity and polished rod motion in a pumping system, the method comprising the steps of:
 a) developing a mathematical model of the pumping system based on system data;
 b) measuring physical conditions of the pumping system during operation;
 c) comparing the mathematical model and the physical conditions as measured;
 d) calculating optimal variable speed of the prime mover and new operating parameters to determine optimal polished rod, sucker rod and downhole pump motion; and
 e) applying the optimal variable speed of the prime mover and new operating parameters to the pumping system.

According to a second aspect of the present invention, there is provided a system for controlling polished rod motion in a pumping system, the polished rod motion determined by actuation of a prime mover, the system comprising:
 a) surface pumping components including the prime mover,
 b) a controller for controlling the prime mover, which controller allows for dynamic changes of speed, acceleration and torque within one cycle;
 c) downhole pumping components including a rod string and downhole pump;
 d) means for communicating motion of the prime mover to the downhole pumping components;
 e) measuring means on the surface pumping components for monitoring operational conditions;
 f) a local control unit;
 g) signal transmission means for transmitting signals from the measuring means and the controller to the local control unit, for determining optimal prime mover speed and required prime mover new operating parameters; and
 h) means for transmitting the new operating parameters to the controller.

In preferred embodiments of a method according to the present invention, the optimal variable speed of the prime mover is determined such that pump stroke length is maximized, stroke time is minimized, forces acting on components of the pumping system are minimized and energy consumption is minimized. Preferably, calculating new operating parameters comprises analysis of pumping system geometry and mechanical properties, the prime mover actuates the polished rod motion (wherein the new operating parameters are applied to the prime mover to achieve optimal polished rod motion), and the new operating parameters are applied to the prime mover by means of controlling velocity, acceleration and torque of the prime mover. Where the pumping system is an hydraulically actuated pumping system, the new operating parameters are preferably applied to the pumping system by means of controlling pressure and flow rate within an actuation system of the pumping system. The optimal variable speed of the prime mover may be achieved by an optimization method selected from the group consisting of theoretical techniques, experimental techniques, and a combination of theoretical and experimental techniques, which techniques would be known to one skilled in the art, and calculating the optimal variable speed of the prime mover may be performed as part of initial pumping system design using a predictive analysis method (without measuring physical conditions of the pumping system).

In preferred embodiments of a system according to the present invention, the measuring means are for measuring polished rod load, walking beam position, tubing pressure, and casing pressure, and the measuring means preferably comprise a transducer for measuring polished rod load, an optical encoder for measuring walking beam position, and pressure transducers for measuring tubing pressure and casing pressure. The controller may comprise one of a dynamic braking resistor and a regenerative module, but neither need be present. The system preferably comprises a remote computing station in communication with the local control unit. The local control unit preferably comprises programming incorporating mathematical modelling and numerical solution techniques capability, for analyzing the signals, determining the optimal prime mover speed, and determining the required prime mover new operating parameters.

In some preferred embodiments of the present invention, the pumping system has the ability to control the polished rod linear velocity according to a pre-programmed or self-adapting function of one of the following variables: time, polished rod position or crank rotation angle. A preferred embodiment of this invention uses a VFD for controlling the prime mover angular speed that produces the optimal polished rod linear variable velocity.

It is most efficient to assume that the angular velocity profile of the prime mover is controlled by a function $\Omega(s)$ of the polished rod position, although it can also be defined as a function $\Omega(t)$ of time or a function $\Omega(\alpha)$ of crank angle. The position of the polished rod $s \in (0, s_0)$ is defined for the full cycle, including the upstroke and down-stroke movement, and therefore $s_0$ corresponds to the double length of the polished rod stroke. The present invention seeks to provide a method and system for optimizing the angular velocity profile $\Omega$ of the prime mover for the entire stroke cycle in order to achieve one of the following goals:

(I) maximize oil production
or
(II) achieve a pre-defined production target using a minimum energy consumption in the pumping unit, while satisfying the following constraints for the duration of the entire stroke period T:

(A) the maximum and minimum stress at any point $x \in (0,L)$ along the entire length L of the rod string doesn't exceed the limits allowed by the modified Goodman diagram:

$$\sigma_{min}(\Omega, x) = \min_{t \in (0,T)} (\sigma(\Omega, x, t)) \geq 0$$

$$\sigma_{max}(\Omega, x) = \max_{t \in (0,T)} (\sigma(\Omega, x, t)) \leq g(\sigma_{min}(\Omega, x))$$

where $g(\sigma_{min}(x))$ depends on the material properties of the rod segment at point x;

(B) the motor speed variation is achievable for a given pumping unit, i.e. the torque $M(\Omega, s)$ doesn't exceed the allowable range $(M_{min}, M_{max})$ specified for the motor and the gear box:

$$M_{min}(\Omega) = \min_{s \in (0,s_0)} (M(\Omega, s)) \geq M_{min}$$

$$M_{max}(\Omega) = \max_{s \in (0,s_0)} (M(\Omega, s)) \leq M_{max}$$

where $M_{min} < 0$ is the minimum allowable negative torque (can be equal to 0 in order to minimize the regenerative torque), as well as the motor angular speed doesn't exceed the specified limit:

$$\Omega(s) < \Omega_{max} \text{ for } s \in (0, s_0)$$

(C) the angular velocity $\Omega(s)$ is the same at the beginning and end of the stroke due to a cyclic character of the pumping operation:

$$\Omega(0) = \Omega(s_0).$$

Because of an inherent time delay in the response of the motor angular velocity to the provided VFD input, the realized motor speed is not the same as the input design speed, therefore it is more efficient to optimize directly the input speed than to find first the optimal motor speed, and subsequently try to determine the input function that actually produces the required motor velocity. Therefore, the function $\Omega(s)$ describes rather the optimal design input speed for the VFD controller than the actual optimal motor speed. It needs to be noted that the effect of optimization of VFD input speed is equivalent to controlling the polished rod velocity in order to optimize the pump production and operation.

It has been observed that the optimal solution that maximizes the production usually has the following properties that are of additional benefit:

The energy use and the maximum stresses in the entire pump system are smaller for the optimal velocity profile $\Omega(s)$ than for the movement with the same cycle period and a constant motor speed equal to the average motor speed of the variable speed cycle When optimizing the energy use to achieve the production target the stresses are reduced with respect to the movement with the same cycle period and a constant motor speed.

Once the optimal VFD input velocity is determined then a further reduction of the motor torque and energy use is achieved by re-adjusting the crank weights to the new operating conditions.

When the optimization is performed not on the existing pumping system, but during the design phase, then the design can be further improved based on the power and load requirements resulting from the prime mover speed determined from the optimization process. Making the design changes to improve the performance of the system powered by the prime mover optimal variable speed, e.g. increasing the diameter of the weakest segments of the rod string, will allow for further improvement of the system performance by applying the pumping system design and prime mover speed optimization processes iteratively.

It should be noted that the optimal prime mover speed and the resulting polished rod velocity determined by the present invention are different than those prescribed in the prior art. For example, U.S. Pat. No. 6,890,156 teaches adjusting the prime mover speed to obtain a constant speed of the polished rod during most of the stroke length (which doesn't necessary optimize the production and reduce loads), while the optimal movement of the polished rod obtained by the present method is not constant in general.

To overcome the limitations of the prior art, the present invention seeks to analyze current performance and calculate and apply the most advantageous variable speed of the prime mover to maximize fluid production for an existing sucker rod pumping system. Some prior art systems would require system components to be changed to achieve any increase in production volume, or otherwise would have to compromise safety conditions if higher fixed speed of the prime mover were to be attempted. Operating costs would also increase since larger components and higher energy consumption would be necessary.

As in the prior art, the measurements of the surface card provide the displacement and force in the polished rod that allow for calculation of the following values that are of importance from the perspective of optimization:

Forces and stresses in the entire rod string that are used for checking condition (A) of the optimization process Effective plunger stroke length that is used for estimation of the oil output that needs to be maximized according to optimization problem (I), or needs to achieve the prescribed production target according to optimization problem (II)

The motor torque measurements provide means for controlling condition (B) of the optimization process. The angular velocity measurements can be used for modelling the delay between the VFD input and the actual motor velocity profile if mathematical modelling is used instead of the physical measurements for finding the response of the pump/well system to a given VFD input velocity. The calculations of the plunger stroke length and the stresses in the rod string based on the surface card measurements are performed using the methods described in literature that employ either the finite difference method or Fourier transformations (e.g. U.S. Pat. No. 3,343,409). The plunger stroke length and the stresses in the rod string, as well as the loads on the surface unit, including the motor torque, can alternatively be calculated without relying on the surface card measurements, by simulating the response of the rod string to the imposed movement of the polished rod using the improved predictive analysis based on original work of Gibbs as presented in the Journal of Petroleum Technology in July 1963. This approach might produce less accurate results, but it is necessary if the physical tests cannot be performed or the measurements cannot be collected, e.g. during the design phase, or the number of test must be limited In order to minimize the disruption of the well production.

The present invention is directed to controlling prime mover speed and, in doing so, polished rod motion so that the downhole pump is reciprocated with any stroke length required to maximize production within the fatigue load limits of the sucker rod. In addition, any desired speed of the downhole pump and behaviour pattern can be controlled to overcome excessive friction, gas lock, or other detrimental downhole conditions.

A detailed description of an exemplary embodiment of the present invention is given in the following. It is to be understood, however, that the invention is not to be construed as limited to this embodiment.

BRIEF DESCRIPTION OF THE DRAWINGS

In the accompanying drawings, which illustrate an exemplary embodiment of the present invention.

DETAILED DESCRIPTION OF A PREFERRED EMBODIMENT

Optimization Method

Figure 1:
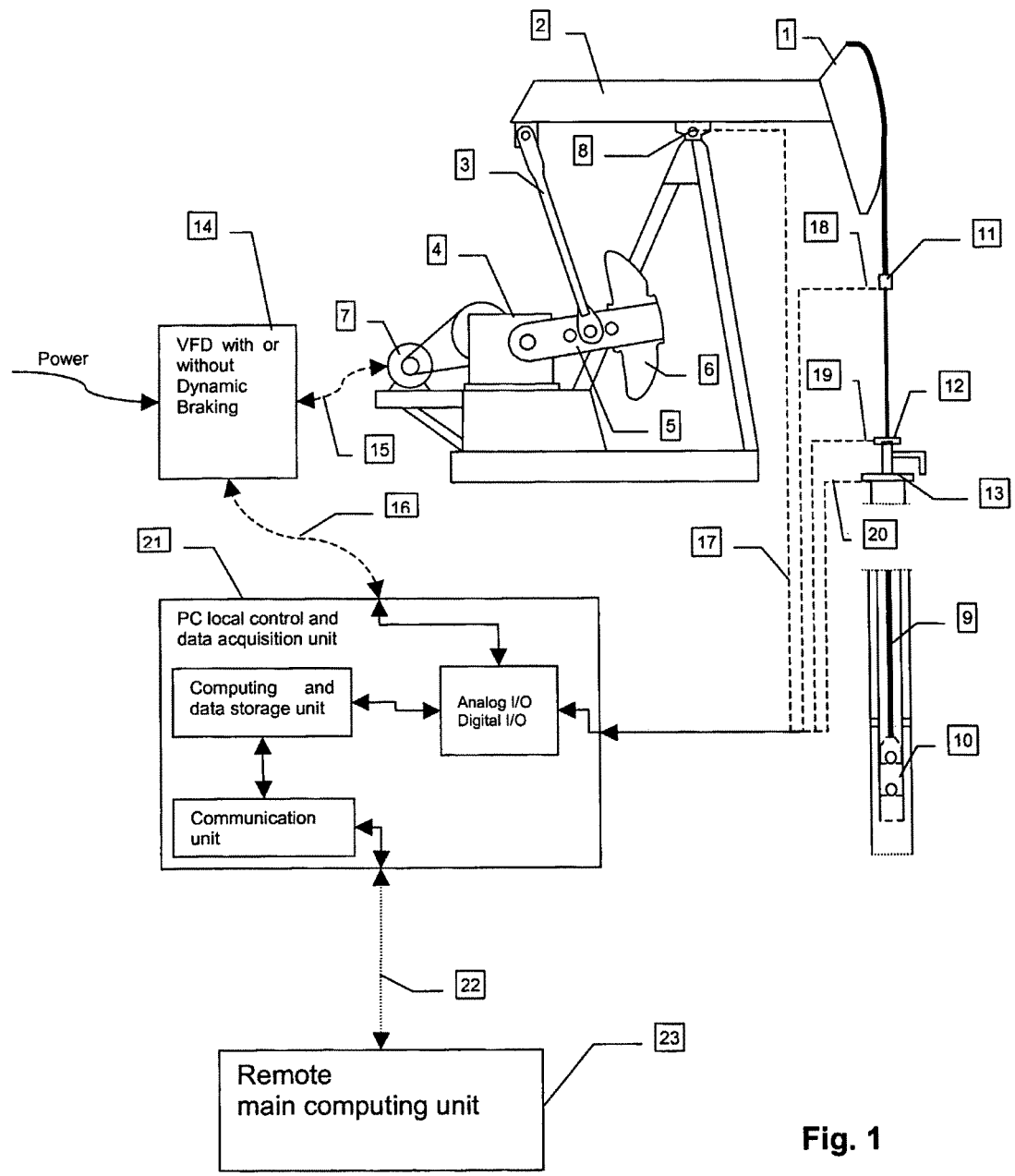
FIG. 1 is a schematic view of a system according to the present invention.

Referring now to the summary, of the present invention set out above, the optimization problem (I) is defined as finding the VFD input angular speed profile $\Omega(s)$ that maximizes the average fluid volume pumped per unit time. The volume pumped during one stroke as a result of the imposed VFD input speed $\Omega(s)$ is equal to:

$$Vol(\Omega) = A_p \eta U_P(\Omega)$$

where $A_p$—plunger cross-sectional area
$\eta$—pumping efficiency coefficient
$U_P(\Omega)$—plunger stroke length (the product $\eta U_P$ is called an effective stroke length).

Therefore, the optimization goal of maximizing the production per unit time can be mathematically defined as finding the VFD input speed profile $\Omega(s)$ that maximizes the following functional $V(\Omega)$, while satisfying the constraints (A-C):

$$V(\Omega) = \frac{Vol(\Omega)}{T(\Omega)} = \frac{A_p \eta U_P(\Omega)}{T(\Omega)} = \text{Maximum}(\Omega) \tag{1}$$

where $T(\Omega)$ is the stroke period resulting from applying the input velocity $\Omega(s)$.

Similarly, the optimization problem (II) can be defined as finding the VFD input speed profile $\Omega(s)$ that minimizes the motor power use $P(\Omega)$, while satisfying the conditions (A-C) together with the following additional constraint:

$$V(\Omega) = \frac{Vol(\Omega)}{T(\Omega)} = \frac{A_p \eta U_P(\Omega)}{T(\Omega)} = V_o \tag{D}$$

where $V_o$ is a prescribed production target.

The power use $P(\Omega)$ can be measured directly by VFD or can be calculated as the work done by the motor per unit time, therefore the following functional needs to be minimized:

$$P(\Omega) = \frac{W(\Omega)}{T(\Omega)} = \text{Minimum}(\Omega) \tag{2}$$

where $W(\Omega)$ is the work done by the positive motor torque during one stoke $$W(\Omega) = \int_0^T M(\Omega, t) \omega(\Omega, t) dt$$

where $W(\Omega)$ is the work done by the positive motor torque during one stoke $$W(\Omega) = \int_0^T M_+(\Omega, t) \omega(\Omega, t) dt$$

where: $\omega(\Omega,t)$ is the motor angular rate described as a function of time.
$M+(\Omega,t)$ is the positive motor torque defined as:

$$M_+(\Omega, t) = \begin{cases} 0 & \text{if } M(\Omega, t) \leq 0 \\ M(\Omega, t) & \text{if } M(\Omega, t) > 0. \end{cases}$$

In order to solve the above optimization problems, i.e. problem (I) with constraints (A-C) or problem (II) with constraints (A-D), we need the ability to obtain the following information in response to any input velocity $\Omega(s)$:

production value $V(\Omega)$, or equivalently, plunger stroke length $U_P(\Omega)$ and stroke period $T(\Omega)$ the distribution of stresses $\sigma(\Omega,x,t)$ for the entire rod string $x \in (0,L)$ and stroke period $t \in (0, T_0)$, and based on this $\sigma_{min}(\Omega,x)$ and $\sigma_{max}(\Omega,x)$ as defined in Condition (A)

the motor torque $M(\Omega, s)$ for the entire stroke length $s \in (0,s0)$, and based on this $M_{min}(\Omega)$ and $M_{max}(\Omega)$ as defined in Condition (B)

prime mover power use P(Ω), or equivalently, the work W(Ω) over a stroke period T(Ω)

The above information for a given input velocity Ω(s) can be obtained in a variety of ways, ranging from totally experimental to purely theoretical. In general, the experimental methods are more accurate, but at the same time require more effort in installing the instrumentation, performing tests and collecting data for each input function Ω(s). Usually, the most efficient approach is to combine both of these methods.

Following is a brief description of some possible approaches:

The production can be measured directly in the experimental way, provided the necessary equipment is available, or can be calculated based on the plunger stroke length and stroke period, either measured or calculated.

The stroke period T(Ω) for a given input velocity Ω(s) can be measured directly by applying this input to the VFD of a real pump/well system, or can be calculated theoretically, assuming the motor velocity follows the VFD input velocity with a constant time delay.

The plunger stroke length can be measured experimentally, e.g. by installing accelerometers at the plunger, or can be calculated in two ways: 1) using the mathematical model of the plunger movement based on the surface card measurements, i.e. the polished rod displacement and force; 2) applying a purely theoretical method by calculating the polished rod movement as a function of the motor speed and using the predictive analysis to find the plunger response to this movement.

The stresses along the rod string could be measured experimentally, e.g. by installing strain sensors at various locations (although it is rather impractical), or can be calculated in two ways: 1) using a mathematical model of the rod string displacements and forces based on the surface card measurements; 2) applying a purely theoretical method by calculating the polished rod movement as a function of the motor speed and using the predictive analysis to find the distributions of the stresses in the rod string.

The motor torque can be measured directly from the VFD output by applying the desired VFD input velocity to the pump/well system or can be calculated, using the equations of dynamic equilibrium of the surface unit, based on the theoretically calculated force in the polished rod obtained from the rod string dynamic model.

The motor power consumption can be measured directly from the VFD output by applying the desired VFD input velocity to the pump/well system, or can be calculated theoretically based on the work done by the theoretically calculated torque for the imposed motor angular velocity.

The optimization problems (I) and (II) are very similar from the mathematical point of view and can be solved using the same methods; therefore, a possible solution will be presented for case (I) only. The solution of problem (I) can be achieved by, but is not limited to, the following iterative approach that was chosen to address the highly nonlinear nature of this problem.

The function Ω[p](s) describing any allowable VFD input speed that meets the condition (C) can be presented in the following form of Fourier series:

$$\Omega[p](s) = \beta \bar{\Omega}_0 \left[ 1 + \sum_{i=1}^{N} (\gamma_i \cos(2\pi i s / s_0) + \lambda_i \sin(2\pi i s / s_0)) \right] \quad (3)$$

where $p=[p_1, \ldots, p_{2N+1}]=[\beta, \gamma_1, \ldots, \gamma_N, \lambda_1, \ldots, \lambda_N]$ is the vector of optimization variables/parameters $\bar{\Omega}_0$—prime mover typical constant operational speed for the specific well and pumping unit N—selected number of terms in the Fourier series, usually not exceeding 4

The purpose of optimization is to find the vector of parameters p for which the function Ω[p](s) maximizes the production V(Ω) defined by (1), while meeting the conditions (A) and (B). Due to the nonlinear nature of this problem, the optimal solution will be found using an iterative approach, starting from some initial set of parameters usually selected based on experience. The closer the initial values are to the optimum the faster the convergence to the optimal point will be achieved. Typically those initial parameters are assumed as follows:

$\beta=1$ $\lambda_1 \in (-0.1, 0.1)$ depending on the sucker-rod material (fibreglass or steel)

$\lambda_1=0$ for i>1

$\gamma_2=0.2, \gamma_1=0(i=1$ or $i>2)$

Now any operational parameters of the pumping system controlled directly or indirectly by the VFD input velocity Ω[p](s), such as the production V(Ω[p], prime mover torque M(Ω[p], s) and stresses in the rod string σ (Ω[p], x,t) can be treated as functions of the parameter vector p:

$V[p]=V(\Omega[p]))$ $M[p](s)=(M(\Omega[p],s)s\epsilon(0,s0)$ $$\sigma[p](x,t)=\sigma(\Omega[p],x,t)x\epsilon(0,L);t\epsilon(0,T) \quad (4)$$

Using one of the methods described earlier, we can determine the values of all the above functions at the starting point $p=p_0$. Then we will search for such a vector $\delta p=[\delta p_1, \ldots, \delta p_{2N+1}]$ for which the functions $\sigma [p_0+\delta p]$ and $M[p_0+\delta p]$ satisfy the constraints (A) and (B), and for which the maximum of the function $V[p_0+\delta p]$ is reached in the vicinity of point $p_0$ $$V[p_0+\delta p]=\text{Maximum}(\delta p) \quad (5)$$

The functions V, M and Γ of parameters p are not available in analytical font and depend on those parameters in a highly nonlinear way; their determination can even involve physical tests. However, these functions can be approximated at point $p_0$ by linear functions of δp using the first order Taylor series;

$$V[p_0 + \delta p] = V[p_0] + \sum_{i=1}^{2N+1} \left[ \frac{\partial V}{\partial p_i}[p_0]\delta p_i + \frac{\partial^2 V}{\partial p_i^2}[p_0]\delta p_i^2 \right] \quad (6a)$$

$$M[p_0 + \delta p](s) = M[p_0](s) + \sum_{i=1}^{2N+1} \left[ \frac{\partial M}{\partial p_i}[p_0](s)\delta p_i + \frac{\partial^2 M}{\partial p_i^2}[p_0](s)\delta p_i^2 \right] \quad (6b)$$

-continued $$\sigma[p_0 + \delta p](s, t) = \qquad (6c)$$

$$\sigma[p_0](s) + \sum_{i=1}^{2N+1}\left[\frac{\partial \sigma}{\partial p_i}[p_0](s, t)\delta p_i + \frac{\partial^2 \sigma}{\partial p_i^2}[p_0](s, t)\delta p_i^2\right]$$

where the partial derivatives of functions V, M and σ are calculated from the finite differences for each i (i=1, . . . , 2N+1) using the following formulas:

$$\frac{\partial V}{\partial p_i}[p_0] = \frac{V[p_0 + \Delta p_i] - V[p_0]}{\Delta p_i} \qquad (7)$$

$$\frac{\partial M}{\partial p_i}[p_0](s) = \frac{M[p_0 + \Delta p_i](s) - M[p_0](s)}{\Delta p_i}$$

$$\frac{\partial \sigma}{\partial p_i}[p_0](s, t) = \frac{\sigma[p_0 + \Delta p_i](s, t'_+) - \sigma[p_0](s, t)}{\Delta p_i}$$

where $$\Delta p_i = [0, \dots, \Delta p_i, \dots 0]$$

$$t'_+ = \frac{T[p_0]}{T[p_0 + \Delta p_i]}t$$

$$T[p] = T(\Omega[p]).$$

Different input parameters $p=p_0+\Delta p_i$ (i=1, . . . , 2N+1) produce variations of the motor speed that can result in a slightly different stroke period T $[p_0+\Delta p_i]$ than for $p=p_0$. In order to be able to superimpose stresses σ (Ω[p], x,t) along the rod string for the same moment during the cycles with different periods the time t can be scaled to a constant reference period T $[p_0]$ e.g. time t defined for the period T $[p_0+\Delta p_i]$ was converted to time $t'_+$ defined for the period T $[p_0]$.

When calculating the partial derivatives using the finite difference method the values $\Delta p_i$ should be selected in a way that ensures a quick convergence to the optimal solution of the nonlinear problem. In order to keep under control the error resulting from the approximation of a nonlinear problem, the following additional constraints are imposed on the values $\delta p_i$ $$|\delta p_i| < \theta \Delta p_1 (i=1,\dots,2N+1) \qquad (E)$$

where θ is initially set to 1, but needs to be reduced if convergence problems are encountered.

As can be see from Eqs. (6a-c) the highly nonlinear optimization problem (I) has been reduced to finding the minimum of a linear function $V[p_0+\delta p]$ of vector δp subject to linear constraints (A), (B) and (E). The solution of this problem can be obtained by those skilled in an using any of the known methods of linear programming.

Having calculated the optimal vector $\delta p_0$ for the approximate optimization problem we can repeat the entire process starting from a new point $p_1=p_0+\delta p_0$ that should be closer to the optimal solution of the original nonlinear problem man point $p_0$. This process can be repeated until there is no change in the optimal vector p from the previous iteration, i.e.

$$\|\delta p\| = \sqrt{\sum_{i}^{2N+1} \delta p_i^2} < \varepsilon \qquad (8)$$

where ε is a selected threshold for the convergence criterion.

The most efficient method is to perform the optimization process in two stages. In the first stage we would find the theoretical optimal solution based only on the predictive analysis without performing tests on the real pump/well system to determine its response to different input velocities (only the basic tests to determine the system parameters would be performed initially). In the second stage we would find the actual optimal solution starting from that theoretical solution by utilizing the responses of the real system to different input velocities required by the optimization algorithm. The transition between those two stages requires changing the optimization parameters from the motor speed to the VFD input velocity. This requires transforming the Fourier series parameters to reflect the time delay between the VFD input velocity and the motor response, which however is fairly straightforward. Adopting this two stage approach may limit the physical tests of the system to only one iteration.

Application Method

As one skilled in the art would appreciate, to calculate optimized prime mover spew, evaluation of current pumping system performance must be based an accurate feedback of the system behaviour. Accurate position of the polished to rod is preferably determined by utilization of an optical encoder, non-contact magneto-resistive rotary position sensor or similar high precision rotary position transducer mounted on the centre bearing of the beam pumping unit or crank. The present invention preferably continuously monitors and transfers all well operating conditions to a centrally-based computer that calculates optimal prime mover speed and corresponding prime mover operating parameters. New parameters are then transferred to a local well controller via wired or wireless means of data transfer. A closed feedback loop between a local controller and the centrally-based computer allows the mathematical model to correct and adjust its parameters to achieve the most accurate representation of the physical state of the downhole and surface components, and it also allows for detecting trends and changes in operating conditions. The controller also allows far detection of any detrimental condition outside of the preset range of loading factors on every component of the pumping system. The amount of rpm, acceleration and torque for every portion of the cycle is accordingly based on following optimal prime mover speed to maximize total volume production while maintaining safe working parameters.

Surface Equipment and Prime Mover

The surface equipment is used to provide the oscillating motion to the sucker rod and the pump at the bottom of the well. The pumping unit usually comprises:

a walking beam with "Horsehead";
a base;
a pitman;
a crank with counterbalance weights; and
a gearbox and motor.

By optimizing speed of the prime mover to properly apply motion of the polished rod to rod string and pump, efficiency of the pumping unit can be improved, power costs can be reduced, stresses in the rod string can be reduced and pumping unit balance can be improved.

Under the condition of variable motor speed, all of these elements rotate and move with variable velocity and acceleration. The effects of acceleration result in dynamic forces and moments that affect the performance of the pumping unit as a whole. For example, acceleration affects gearbox torque, motor power consumption, the strength of the walking beam and wearing of the gearbox, etc. Proper loading of the gearbox is of extreme importance, as an under-loaded unit operates at low mechanical efficiency. The overloaded unit can be easily damaged and then requires excessive maintenance. The calculation of the dynamic torque values and prediction/optimization of the performance of the pumping unit is possible only if the correct data about the weights and moments of the inertia of the moving and rotating elements of the pumping unit is known. This data is required for evaluation of the performance before any optimization can be performed. In accordance with the preferred embodiment, most of the information that is necessary to calculate torques, counterbalance loads, etc., is obtained automatically.

Sucker Rod and Pump Performance

A sucker rod is a long elastic rod consisting of several lengths of different cross-sections. The rod is attached at one end to the walking beam of the pumping unit by means of the horsehead and polished rod, and to the downhole pump at the other end. It is necessary to keep the stresses and safety factors of the rod within the recommended guidelines corresponding to the fatigue strength of the material of the rod. The estimation of the stresses in the rod is performed using a mathematical model of the rod string, based on one of the following:

the loads in the polished rod measured at the surface (diagnostic analysis)

estimation of the forces acting on the plunger at the bottom of the well (predictive analysis).

The calculation of the stresses in the rod string creates complex mechanical and mathematical problems due to the fact that:

the elastic rod string is very long and undergoes nonlinear displacements and possibly buckling;

the rod has complex three-dimensional geometry;

the rod moves inside the tubing, not only along the tubing but also laterally;

the rod is in contact with the tubing in unpredictable places along the rod; and the rod is submerged in a viscous fluid.

The mathematical model of the rod string requires detailed and precise information on many parameters to be able to precisely define the sucker rod loads and stresses. It is accordingly necessary to first establish an appropriate mathematical model of the rod string dynamics with correct values of the parameters, and then solve using available and effective mathematical methods. The additional information necessary for the optimization process is the available measured data obtained at the well. Instantaneous measurements of the flow from the well and the production rate, with pattern recognition tools being used for the identification of the bottom-hole diagrams, provide a large amount of the information that can be used. The system software replicates the dynamic behaviour of the system using the measured surface dynamometer card and the measured production rate. The software can automatically select best pumping conditions to reduce the rod loads and determine the profile of the motor speed within the pumping cycle as required for desirable pump motion. It can select the optimal value of the pumping speed, and determine the optimal prime mover speed. All of these changes can be made with minimum expenditure, and operating cost reduction can be achieved since no physical changes to the configuration of the surface unit, rod string or pump are necessary (as long as the unit contains all the required components of the present invention).

Applications

While numerous applications of the within techniques and methods for controlling the prime mover speed and, consequently, the polished rod motion will now be obvious to one skilled in the art, certain applications are seen as being of particular utility within the field of downhole fluid production.

Using the techniques and methods taught herein, for example, the performance and optimum operating parameters of the reciprocating pump located below the fluid level of the well and connected to a reciprocating mechanism on the surface with an elastic sucker rod system can be determined by:

a) calculation of the performance of the elastic sucker rod and pump by any appropriate numerical method that would be known to one skilled in the art to accurately identify and calculate all variables in the mechanical system of the sucker rod, downhole pump and surface unit with dynamically changing velocities and accelerations of all the components that possess mass and inertia of such a system, changing mechanical and viscous friction, etc.; and b) calculation of the optimized performance and optimized behaviour of the surface unit such as, but not limited to, beam pumping, long stroke or hydraulically actuated unit with a prime mover operating with intentionally prescribed non-constant rotational velocity within a single reciprocating cycle to produce the desired optimized behaviour of the polished rod, rod string and downhole pump.

The methods and techniques taught herein can also provide the means for improving pumping performance of a sucker rod pumping system by controlling pumping system behaviour which comprise:

a) a variable frequency drive and electric prime mover, with or without a braking or regenerative unit, to control reciprocating motion of the surface unit as per optimized parameters within a single cycle of the motion with non-constant rotational velocity, acceleration and torque;

b) a local control unit that may be a programmable controller or digital processor based computer with single or multitasking operating system, separate or an integral part of the variable frequency drive, to input desired characteristics of reciprocating motion of the surface unit to the variable frequency drive at a minimum rate of 24 times within a single reciprocating cycle;

c) a local data acquisition unit that may be a programmable controller or digital processor based computer with single or multitasking operating system, separate or an integral part of the variable frequency drive, to record time, angular velocity, acceleration and torque parameters of the variable frequency drive, load and position of the polished rod, tubing pressure and casing pressure, and optional flow rate within a single reciprocating cycle; and d) a remote computing station with closed feedback loop via a communication link to optimize and control the local control unit. The remote computing station may be remotely located or located locally and control one or any other number of local control units.

This system is discussed in further detail below.

The techniques and methods taught herein can also enable automatically changing operating parameters of the sucker rod pumping unit in response to changing conditions in the well or in surface components by:

a) establishing real-time always-on communication with the pumping unit local controller via Internet network that may be wired or wireless via radio, wireless cell or satellite communication network;

b) calculating optimized operating parameters using any appropriate numerical method that would be known to one skilled in the art and programming these into a local well controller alarm or shut-down detection means to detect within a single stroke step if operating conditions of the pumping unit are exceeding predetermined values;

c) implementing corrective action as programmed into the local control unit, which corrective action may be an alarm condition, immediate shut-down, slow shut down within single cycle or switching to predetermined emergency operating conditions;

d) initiating communication with a remote computing station immediately or within a predetermined time period;

e) implementing a corrective action routine into the remote computing station to automatically analyze the new condition of the pumping unit that has exceeded previously calculated best operating conditions;

f) automatically, or with assistance of personnel, downloading new operating parameters to the local control unit to correct behaviour of the pump in the new conditions; and g) automatically, or with assistance of personnel, downloading new operating parameters to the local control unit to change to distribution rate of chemical agents in response to increased friction in the well due to deposit of various substances.

As a final example of the utility of the present invention, the within techniques and methods can be employed to automatically prevent or remove gas lock condition at the pump, by:

a) detecting gas lock condition from forces acting on the plunger during down-stroke motion;

b) calculating bubble point pressure as occurring during flow of fluid that may be oil with or without water and gas through the narrowest section of the standing valve opening;

c) calculating optimal motion of the plunger to minimize velocity of the plunger during upstroke motion in order to minimize velocity of the fluid and the pressure drop in the fluid at the standing valve and keep it above bubble point pressure; and d) controlling velocity and acceleration of the prime mover within calculated optimal motion to minimize or remove gas lock condition with precise polished rod movement.

These are only a few examples of how the present invention can be applied to address a number of practical operational situations experienced in the field of downhole fluid production, employing the methods and system taught herein.

System

Referring now in detail to the accompanying drawings, there is illustrated an exemplary embodiment of a system according to the present invention.

Referring to FIG. 1, a typical oil well beam pumping unit consists of many moving parts that will produce significant inertia forces if accelerated or decelerated on top of typical static forces. A horsehead 1 connects the rod system 9 and pump 10 with the walking beam 2 using bridle cables and rod hanger. A pitman arm 3 connects the walking beam 2 to the crank 5 with attached counterweights 6. The crank 5 is attached to a shaft of the gearbox 4 that is powered through a belt system by the prime mover 7.

The rod system 9 and pump 10 are subjected to mechanical friction (due to interaction of the pump 10 with the barrel and the rod 9 with tubing), fluid friction (due to the rod 9 moving in the viscous fluid and viscous fluid moving in the tubing and through the valves of the pump 1), and force clue to hydrostatic pressure and inertia of the fluid. The rod system 9 is an elastic connection between surface components and the downhole pump 10. The elastic behaviour is greatly influenced by the dimensions and material properties of each rod section and by the depth of the well. Due to the elasticity of the rod 9 and cyclic changes in the polished rod force, velocity, and acceleration, the sucker rod 9 is vibrating in longitudinal and transverse directions in the well.

Four measuring means or transducers are mounted on the pumping unit. Load measuring means or a transducer 11, which may be a strain gauge load cell, is connected to the polished rod and provides an output signal that is proportional to the load. A high accuracy, position measuring means, which may be an optical encoder 8, is mounted on the centre bearing and is anchored to the Samson post; it provides accurate position measurement of the walking beam 2 regardless of rotational speed or acceleration. Two pressure transducers are mounted on the wellhead, namely a tubing pressure transducer 12 and a casing pressure transducer 13; they provide an accurate pressure signal to properly evaluate pump behaviour during every cycle.

The beam pumping unit is driven by the prime mover 7, which may be a high efficiency Nema B motor, to reciprocate the polished rod in any required motion pattern. The polished rod is connected through various tapers of the sucker rod 9 with the downhole pump 10. The present invention is directed to controlling the polished rod motion so that the downhole pump 10 is reciprocated with any required stroke length to maximize production within the fatigue load limits of the sucker rod 9. In addition, any desired speed of the downhole pump 10 and behaviour pattern can be controlled to overcome excessive friction, gas lock and other detrimental downhole conditions.

Figure 2A:
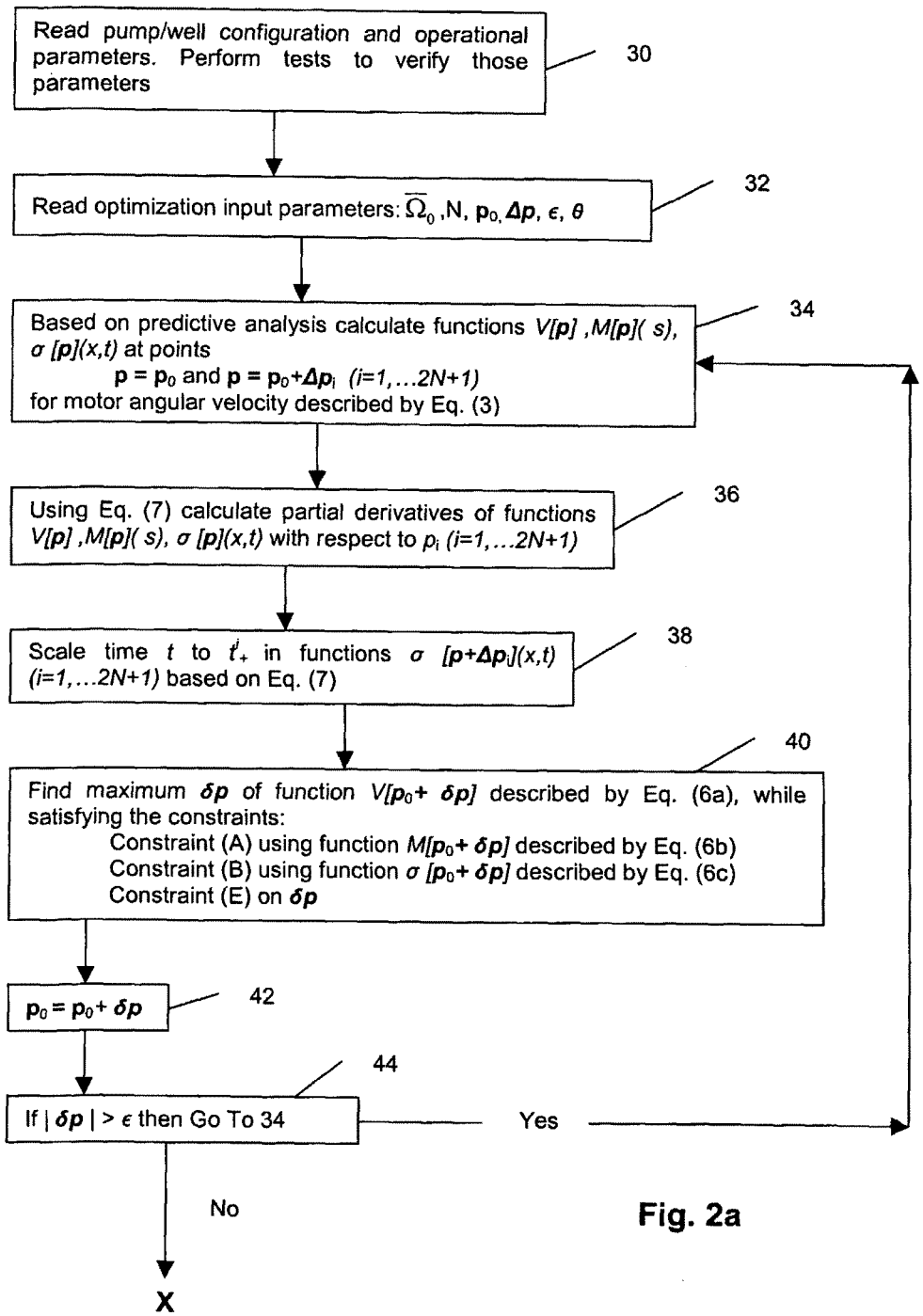
FIGS. 2a and 2b present a flowchart illustrating a preferred process for use in software development for an embodiment according to the present invention.
Figure 2B:
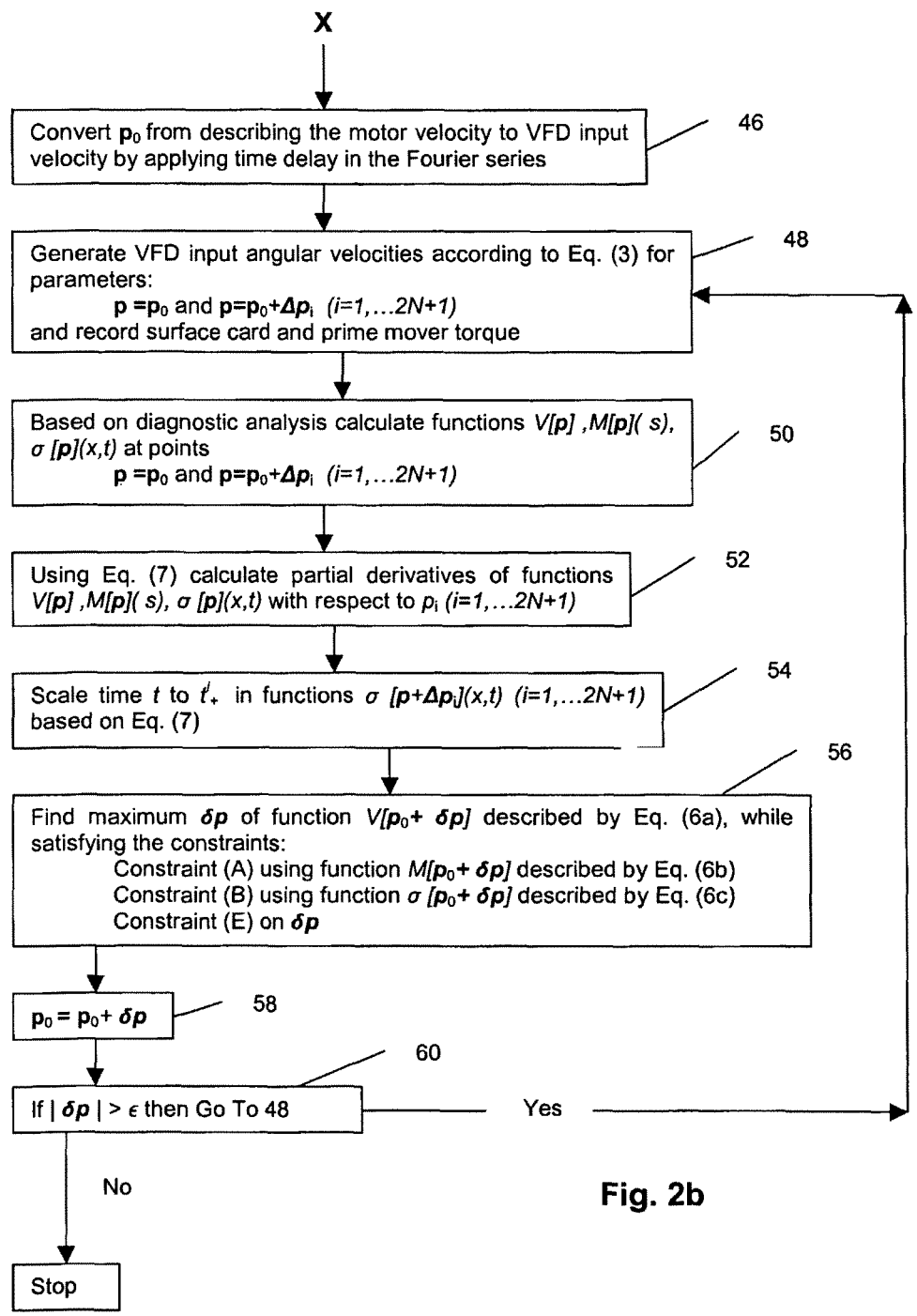

As illustrated in FIG. 1, a position signal 17, a load signal 18, a tubing pressure signal 19 and a casing pressure signal 20 are transmitted to a local control unit 21 that converts, computes and stores this information by means of digital storage that may be, put is not limited to, a hard drive or solid state memory modules. Additional speed and torque signals 16 are transmitted to the control unit 21 from a typical variable frequency drive controller 14 that controls behaviour of the prime mover 7 through voltage, current and frequency of the power supplied to the electric prime mover 7. The prime mover 7 and variable frequency drive controller communicate by means of a signal 15. The variable frequency drive controller 14 may include a dynamic braking resistor and various other components, and may be of any appropriate type commercially available. The local control unit 21 transmits all gathered information via communication unit to a remote computing station 23 that may be a high computing power desktop computer with a multitasking operating system. Various means of communication 22 may be used such as wired radio, Internet, wireless cell network, telephone network or satellite communication. The communication link facilitates a closed loop feedback system between the local control unit 21 and the remote computing station 23. Downhole and surface operating conditions are analyzed and optimized by means of software based on the process summarized in FIGS. 2a and 2b, which includes both predictive and diagnostic analysis. Steps 30 to 44 are set out in FIG. 2a, with subsequent steps 46 to 60 in FIG. 2b.

FIGS. 3 to 6 provide operational data from a 9,057 feet deep well that was one of four test sites employed for validation of the present invention. A conventional geometry pumping unit (640-365-168) was connected to a 1.75 inch diameter heavy wall rod pump by a steel sucker rod string assembled from five sections of different diameters. Data was obtained from a typical fixed speed and from optimized mode with optimal variable angular velocity of the prime mover. The downhole pump stroke length was verified by measurement of production volume over a 24 hour period. Fluid level measurement data was used to verify calculated forces on the plunger. Long-term data collection in excess of six months was performed to ensure sustainability of performance and to allow for further development of hardware, optimization technique, and software.

Figure 3:
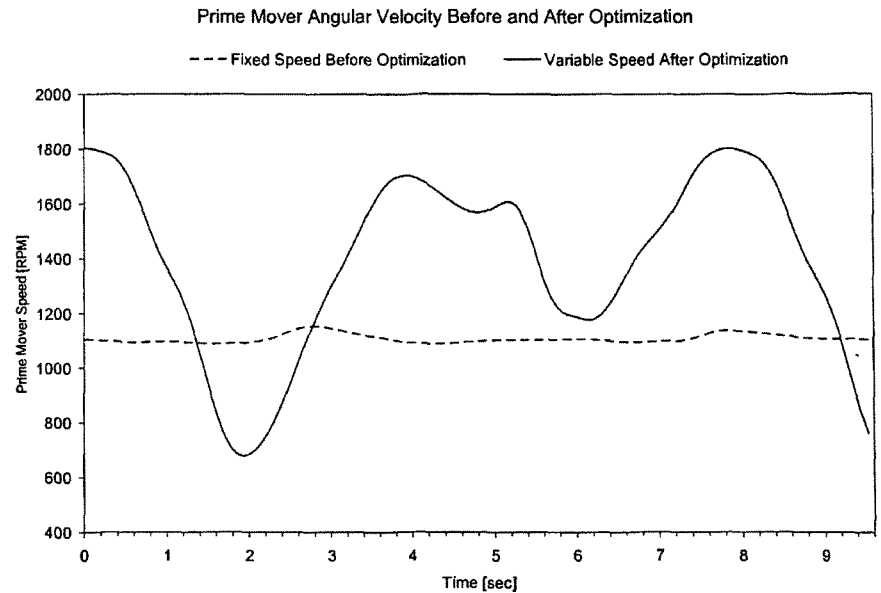
FIG. 3 is a chart illustrating prime mover angular velocity before and after optimization.

FIG. 3 provides a chart illustrating measured prime mover speed for two cases: a constant speed resulting in pumping rate of 6.3 strokes per minute (SPM) and the optimized variable prime mover speed that results in 7.6 SPM.

Figure 4:
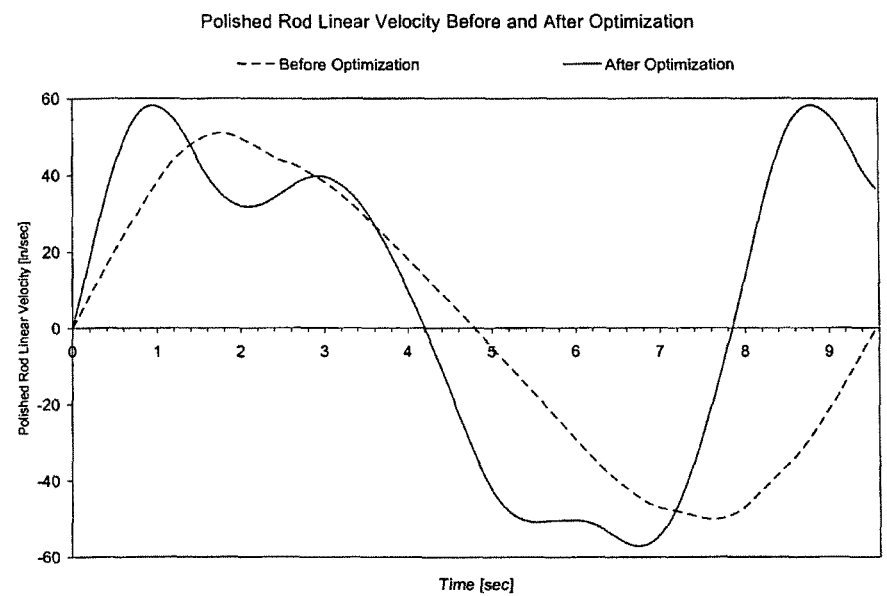
FIG. 4 is a chart illustrating polished rod linear velocity before and after optimization.

FIG. 4 provides a chart illustrating measured polished rod linear velocity before and after optimization. It is clear that the optimal speed is not constant at any portion of the stroke, as prescribed by some prior art, and is significantly different from the typical one resulting from a constant prime mover angular velocity.

Figure 5:
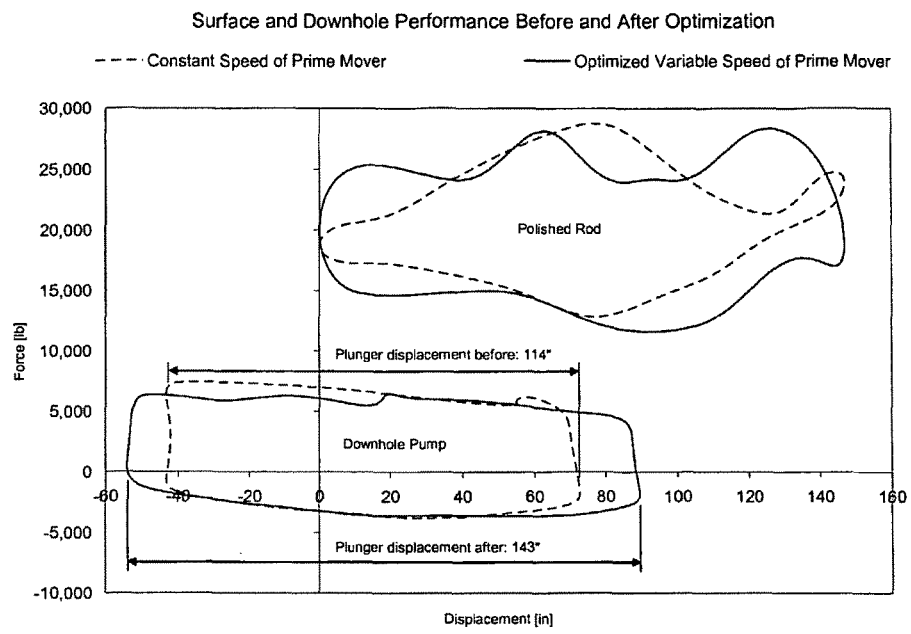
FIG. 5 is a chart illustrating polished rod forces vs. displacement and plunger pump forces vs. displacement during operation of a pump with constant prime mover velocity and with optimized speed of prime mover.

FIG. 5 provides a chart illustrating measured polished rod and calculated plunger forces vs. displacement during operation of a pump with constant angular velocity and the optimal variable velocity of prime mover. The constant angular velocity corresponding to 6.3 SPM produces the pump stroke of 114 inches as calculated by evaluation software and confirmed by actual fluid flow measurements from the well on the surface. As a result of applying the optimal variable speed to the prime mover, the stroke period has reduced to the equivalent of 7.6 SPM, and the pump stroke length has increased to 143 inches as calculated by the evaluation software and confirmed by the actual fluid flow from the well on the surface. The resulting dramatic increase in production is due both to increase of the pump stroke length (25%) and reduction of the stroke time (20%). There was no increase in the forces acting on any component of the well, and due to utilizing inertia of the rotating weights the electric power demand was decreased by 27%. For those skilled in art it will be obvious that for any typical well, by increasing the constant speed of the prime mover in order to increase the pump stroke rate from 6.3 SPM to 7.6 SPM, a much smaller increase in the pump stroke would be realized, while electric power demand and forces acting on the system would significantly increase.

Figure 6:
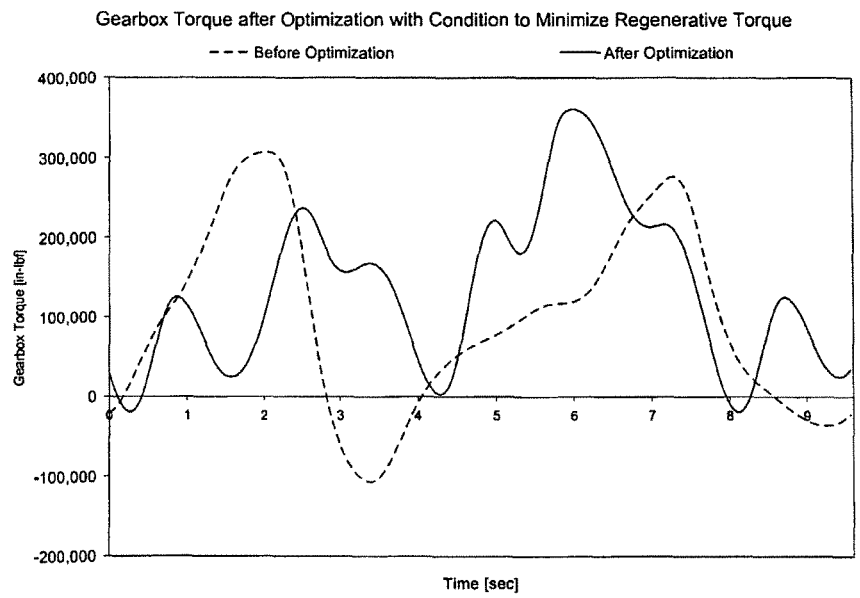
FIG. 6 is a chart illustrating gearbox torque before and after optimization where optimal condition was prescribed as minimization of regenerative torque acting in the gearbox.

FIG. 6 provides a chart illustrating measured gearbox torque acting in the gearbox before and after optimization. As gearbox torque was significantly under the maximum rated torque, the objective was to lower the regenerative torque to its minimum in order to lower negative impact on longevity of the gearbox.

The optimal speed, acceleration, and torque of the prime mover, and the safe operating limits, are calculated and transferred together to the local control unit 21. The response of the unit after minimum one full cycle is then transferred via communication unit back and analyzed in the remote computing station 23. If the optimized parameters are satisfied (such as calculated pump stroke length, stroke time, power consumption, loads and stress level in the rod system and surface components, fluid velocity at the standing valve, maximum and minimum motor torque or any other), calculations are not performed anymore unless deterioration of the well performance is detected in the future. Periodically, for every predetermined time interval, the remote unit 23 or local unit 21 will initiate communication to check the status of the pumping unit. The local control unit 21 will provide the variable frequency drive 14 with the calculated rpm, and acceleration for a minimum 24 steps within each cycle, and will monitor behaviour of the pumping unit during each step according to safe operating parameters such as maximum and minimum load on polished rod, motor torque, gearbox torque, polished rod displacement, tubing pressure, casing pressure and stroke time.

If any of the safe operating parameters are outside of the prescribed values, the local unit 21 will initiate corrective action such as slow down or shut down of the unit and an alarm message will be generated and sent to the remote computing station 23 via the closed loop feedback system. Last operating conditions will be transferred to the remote computing station 23 and new optimized operating parameters will be computed and transferred to the local unit 21.

While a particular embodiment of the present invention has been described in the foregoing, it is to be understood that other embodiments are possible within the scope of the invention and are intended to be included herein. It will be clear to any person skilled in the art that modifications of and adjustments to this invention, not shown, are possible without departing from the spirit of the invention as demonstrated through the exemplary embodiment. The invention is therefore to be considered limited solely by the scope of the appended claims.

Embodiments of the invention in which an exclusive property or privilege is claimed are defined as follows:

1. A method for controlling a prime mover speed in a pumping system for a well, the prime mover being operable at a variable instantaneous speed and controlled by a controller, the pumping system comprising a downhole pump and a connecting assembly comprising a rod string movable at a variable linear velocity for operably connecting the prime mover and the downhole pump to provide reciprocal motive force to the downhole pump, the method comprising:

varying an instantaneous speed of the prime mover by applying a set of optimal prime mover speed values previously generated for an entire stroke cycle to the controller, wherein the set of optimal prime mover speed values is generated for the entire stroke cycle to satisfy an optimization goal of maximizing a pumping system output production rate, subject to a set of constraints comprising:

minimum and maximum stresses along the rod string over the entire stroke cycle;

an allowable force or torque range of the prime mover; and a maximum prime mover speed, such that the instantaneous speed of the prime mover is substantially varied throughout the entire stroke cycle, wherein the set of optimal prime mover speed values was previously generated by a method comprising:

representing prime mover speed values over the entire stroke cycle using a function $\Omega[p](x)$ comprising a mathematical formula defined with coefficient vector p comprising a finite number of coefficients $[p_1, p_2, \ldots, p_m]$, and variable x, wherein x denotes either a time value or a stroke position within an interval $(0, x_0)$ of the stroke cycle, the stroke cycle comprising an upstroke and a downstroke movement of a polished rod comprised in the rod string; and determining the set of optimal values of p, such that the function $\Omega[p](x)$ satisfies the optimization goal and the set of constraints, wherein $\Omega[p](x)$ comprises a Fourier series, the coefficient vector p comprises Fourier coefficients, and $\Omega[p](x)$ is defined as:

$$\Omega[p](x) = \beta\Omega_0\left[1 + \sum_{i=1}^{N}(\gamma_i\cos(2\pi ix/x_0) + \lambda_i\sin(2\pi ix/x_0))\right]$$

wherein p comprises the Fourier coefficients $[\beta, \gamma_1, \ldots, \gamma_N, \lambda_1, \ldots, \lambda_N]$ and $\Omega_0$ is an operating constant prime mover speed defined for the pumping system, and determining the set of optimal values of the coefficient vector p comprises:
(i) selecting an initial vector $p_0$ of the coefficient vector p, and m vectors $\Delta p_i$, each vector comprising a prescribed incremental change $\Delta p_i$ of only one coefficient $p_i$ (i=1, ... m);
(ii) calculating, using the model, output values comprising a production rate V[p], a prime mover torque M[p](t) and a stress distribution of the rod string $\sigma[p](z, t)$ varying with distance z along the length of the rod string and time t in the stroke cycle, the said output values calculated for the prime mover speed varying over the entire stroke cycle according to $\Omega[p]$ having a stroke period T[p] and determined at $p=p_0$ and $p=p_0+\Delta p_i$ (i=1, ... m);
(iii) calculating partial derivatives of the functions V[p], M[p](t), $\sigma[p](z, t)$ and T[p] with respect to parameters $p_i$ (i=1, ... m) using a finite difference method with the incremental values of the said functions calculated in step (ii) above;
(iv) linearizing the functions V[p], M[p](t), $\sigma[p](z, t)$ and T[p] by approximating the said functions at point $p_0$ using a first order Taylor series expansion and the partial derivatives obtained in step (iii), the linearized functions having arguments consisting of small changes $\delta p_i$ of parameters p;
(v) applying a linear programming method to find vector $\delta p=[\delta p_1, \delta p_2, \ldots, \delta p_m,]$ that satisfies the optimization and the set of constraints;
(vi) replacing the initial vector $p_0$ with $p_0+\delta p$ and repeating steps (iii)-(v) until $\delta p$ is smaller than a selected threshold;
such that p is defined as $p_0$ when $\delta p$ is smaller than the selected threshold.

2. The method of claim 1, wherein the set of constraints further comprise at least one of:
a maximum energy consumption of the prime mover;
a maximum linear velocity of at least one point along the rod string; or
a maximum output power of the prime mover.

3. The method of claim 2, wherein the set of constraints further comprises a prime mover speed at a beginning of the stroke cycle of the pumping system matching a prime mover speed at an end of the stroke cycle; and wherein the set of optimal prime mover speed values is generated once for a plurality of consecutive stroke cycles.

4. The method of claim 3, further comprising the step of generating the set of optimal prime mover speed values using a model representing components of the pumping system for predicting a response of the pumping system relative to the optimization goal and the set of constraints for a given instantaneous prime mover speed, said response comprising at least one of the following:
pumping system output production rate;
stresses along the rod string;
a torque or force of the prime mover; or
energy consumption.

5. A method for controlling a prime mover speed in a pumping system for a well, the prime mover being operable at a variable instantaneous speed and controlled by a controller, the pumping system comprising a downhole pump and a connecting assembly comprising a rod string movable at a variable linear velocity for operably connecting the prime mover and the downhole pump to provide reciprocal motive force to the downhole pump, the method comprising:
varying an instantaneous speed of the prime mover by applying a set of optimal prime mover speed values previously generated for an entire stroke cycle to the controller, wherein the set of optimal prime mover speed values is generated for the entire stroke cycle to satisfy an optimization goal of minimizing a pumping system energy consumption for a predefined output production rate, subject to a set of constraints comprising:
minimum and maximum stresses along the rod string over the entire stroke cycle;
an allowable force or torque range of the prime mover; and
a maximum prime mover speed,
such that the instantaneous speed of the prime mover is substantially varied throughout the entire stroke cycle,
wherein the set of optimal prime mover speed values was previously generated by a method comprising:
representing prime mover speed values over the entire stroke cycle using a function $\Omega[p](x)$ comprising a mathematical formula defined with coefficient vector p comprising a finite number of coefficients $[p_1, p_2, \ldots, p_m]$, and variable x, wherein x denotes either a time value or a stroke position within an interval $(0, x_0)$ of the stroke cycle, the stroke cycle comprising an upstroke and a downstroke movement of a polished rod comprised in the rod string; and
determining the set of optimal values of p, such that the function $\Omega[p](x)$ satisfies the optimization goal and the set of constraints,
wherein $\Omega[p](x)$ comprises a Fourier series, the coefficient vector p comprises Fourier coefficients, and $\Omega[p](x)$ is defined as:

$$\Omega[p](x) = \beta\Omega_0 \left[ 1 + \sum_{i=1}^{N} (\gamma_i \cos(2\pi i x / x_0) + \lambda_i \sin(2\pi i x / x_0)) \right]$$

wherein p comprises the Fourier coefficients $[\beta, \gamma_1, \ldots, \gamma_N, \lambda_1, \ldots, \lambda_N]$ and $\Omega_0$ is an operating constant prime mover speed defined for the pumping system, and determining the set of optimal values of the coefficient vector p comprises:
(i) selecting an initial vector $p_0$ of the coefficient vector p, and m vectors $\Delta p_i$, each vector comprising a prescribed incremental change $\Delta p_i$ of only one coefficient $p_i$ (i=1, ... m);
(ii) calculating, using the model, output values comprising a production rate V[p], a prime mover torque M[p](t) and a stress distribution of the rod string $\sigma[p](z, t)$ varying with distance z along the length of the rod string and time t in the stroke cycle, the said output values calculated for the prime mover speed varying over the entire stroke cycle according to $\Omega[p]$ having a stroke period T[p] and determined at $p=p_0$ and $p=p_0+\Delta p_i$ (i=1, ... m);
(iii) calculating partial derivatives of the functions V[p], M[p](t), $\sigma[p](z, t)$ and T[p] with respect to parameters $p_i$ (i=1, ... m) using a finite difference method with the incremental values of the said functions calculated in step (ii) above;
(iv) linearizing the functions V[p], M[p](t), $\sigma[p](z, t)$ and T[p] by approximating the said functions at point $p_0$ using a first order Taylor series expansion and the partial derivatives obtained in step (iii), the linearized functions having arguments consisting of small changes $\delta p_i$ of parameters p;
(v) applying a linear programming method to find vector $\delta p=[\delta p_1, \delta p_2, \ldots, \delta p_m,]$ that satisfies the optimization and the set of constraints;

(vi) replacing the initial vector $p_0$ with $p_0+\delta p$ and repeating steps (iii)-(v) until $\delta p$ is smaller than a selected threshold;

such that p is defined as $p_0$ when $\delta p$ is smaller than the selected threshold.

6. The method of claim 5, wherein the set of constraints further comprise at least one of:
  a maximum linear velocity of at least one point along the rod string; or
  a maximum output power of the prime mover.

7. The method of claim 6, wherein the set of constraints further comprises a prime mover speed at a beginning of the stroke cycle of the pumping system matching a prime mover speed at an end of the stroke cycle; and wherein the set of optimal prime mover speed values is generated once for a plurality of consecutive stroke cycles.

8. The method of claim 7, further comprising the step of generating the set of optimal prime mover speed values using a model representing components of the pumping system for predicting a response of the pumping system relative to the optimization goal and the set of constraints for a given instantaneous prime mover speed, said response comprising at least one of the following:
  pumping system output production rate;
  stresses along the rod string;
  a torque or force of the prime mover; or
  energy consumption.

9. A method for controlling a prime mover speed in a pumping system for a well, the prime mover being operable at a variable instantaneous speed and controlled by a controller, the pumping system comprising a downhole pump and connecting assembly comprising a rod string movable at a variable linear velocity for operably connecting the prime mover and the downhole pump to provide reciprocal motive force to the downhole pump, the method comprising:
  varying an instantaneous speed of the prime mover by applying a set of optimal prime mover speed values previously generated for an entire stroke cycle to the controller, wherein the set of optimal prime mover speed values is generated for the entire stroke cycle to satisfy an optimization goal of minimizing stresses along the rod string for a predefined output production rate, subject to a set of constraints comprising:
    an allowable force or torque range of the prime mover; and
    a maximum prime mover speed,
  such that the instantaneous speed of the prime mover is substantially varied throughout the entire stroke cycle,
  wherein the set of optimal prime mover speed values was previously generated by a method comprising:
  representing prime mover speed values over the entire stroke cycle using a function $\Omega[p](x)$ comprising a mathematical formula defined with coefficient vector p comprising a finite number of coefficients $[p_1, p_2, \ldots, p_m]$ and variable x, wherein x denotes either a time value or a stroke position within an interval $(0, x_0)$ of the stroke cycle, the stroke cycle comprising an upstroke and a downstroke movement of a polished rod comprised in the rod string; and
  determining the set of optimal values of p, such that the function $\Omega[p](x)$ satisfies the optimization goal and the set of constraints,
  wherein $\Omega[p](x)$ comprises a Fourier series, the coefficient vector p comprises Fourier coefficients, and $\Omega[p](x)$ is defined as:

$$\Omega[p](x) = \beta\overline{\Omega}_0\left[1 + \sum_{i=1}^{N}(\gamma_i\cos(2\pi i x/x_0) + \lambda_i\sin(2\pi i x/x_0))\right]$$

wherein p comprises the Fourier coefficients $[\beta, \gamma_1, \ldots, \gamma_N, \lambda_1, \ldots, \lambda_N]$ and $\Omega_0$ is an operating constant prime mover speed defined for the pumping system, and determining the set of optimal values of the coefficient vector p comprises:

(i) selecting an initial vector $p_0$ of the coefficient vector p, and m vectors $\Delta p_i$, each vector comprising a prescribed incremental change $\Delta p_i$ of only one coefficient $p_i$ (i=1, \ldots m);

(ii) calculating, using the model, output values comprising a production rate V[p], a prime mover torque M[p](t) and a stress distribution of the rod string $\sigma[p](z, t)$ varying with distance z along the length of the rod string and time t in the stroke cycle, the said output values calculated for the prime mover speed varying over the entire stroke cycle according to $\Omega[p]$ having a stroke period T[p] and determined at $p=p_0$ and $p=p_0+\Delta pi$ (i=1, \ldots m);

(iii) calculating partial derivatives of the functions V[p], M[p](t), $\sigma[p](z, t)$ and T[p] with respect to parameters $p_i$ (i=1, \ldots m) using a finite difference method with the incremental values of the said functions calculated in step (ii) above;

(iv) linearizing the functions V[p], M[p](t), $\sigma[p](z, t)$ and T[p] by approximating the said functions at point $p_0$ using a first order Taylor series expansion and the partial derivatives obtained in step (iii), the linearized functions having arguments consisting of small changes $\delta p_i$ of parameters p;

(v) applying a linear programming method to find vector $\delta p=[\delta p_1, \delta p_2, \ldots, \delta p_m,]$ that satisfies the optimization and the set of constraints;

(vi) replacing the initial vector $p_0$ with $p_0+\delta p$ and repeating steps (iii)-(v) until $\delta p$ is smaller than a selected threshold;

such that p is defined as $p_0$ when $\delta p$ is smaller than the selected threshold.

10. The method of claim 9, wherein the set of constraints further comprise at least one of:
  a maximum energy consumption of the prime mover;
  a maximum linear velocity of at least one point along the rod string; or
  a maximum output power of the prime mover.

11. The method of claim 10, wherein the set of constraints further comprises a prime mover speed at a beginning of the stroke cycle of the pumping system matching a prime mover speed at an end of the stroke cycle; and wherein the set of optimal prime mover speed values is generated once for a plurality of consecutive stroke cycles.

12. The method of claim 11, further comprising the step of generating the set of optimal prime mover speed values using a model representing components of the pumping system for predicting a response of the pumping system relative to the optimization goal and the set of constraints for a given instantaneous prime mover speed, said response comprising at least one of the following:
  pumping system output production rate;
  stresses along the rod string;
  a torque or force of the prime mover; or
  energy consumption.

13. The method of any one of claim 1, 5, or 9, wherein the generation of the set of optimal prime mover speed values further comprises calculating corresponding values of $\Omega[p](x)$ over an entire stroke cycle for a set of either predetermined time instances or predetermined stroke positions, using the set of optimal values of the coefficient vector p.

14. The method of any one of claim 1, 5, or 9, wherein the rod string comprises a polished rod, the generation of the set of optimal prime mover speed values comprises representing polished rod velocity values over the entire stroke cycle, and determining a set of optimal values for the polished rod velocity in satisfaction of the set of constraints.

15. The method of claim 14, wherein the rod string further comprises a sucker rod connected to the polished rod and to a plunger of the downhole pump, and at least a portion of the rod string operates inside a tubing filled with a fluid, and wherein the model further comprises at least one of:
- a force acting on the plunger determined from at least a hydrostatic pressure from a fluid surrounding the plunger;
- mechanical properties of the rod string;
- characteristics of interactions between the rod string, the tubing, and the fluid filling the tubing; or
- rod string displacements and velocities during the entire stroke cycle in response to a given polished rod movement.

16. The method of claim 14, wherein the connecting assembly further comprises a pumpjack and the model further comprises the prime mover force or torque being determined from at least one of:
- a force in the polished rod;
- inertial properties and distribution of masses in the pumpjack;
- inertial properties of the prime mover;
- inertial properties of a speed reduction mechanism in the pumpjack; or
- an acceleration of the prime mover.

17. The method of any one of claim 1, 5, or 9, wherein the set of optimal prime mover speed values is provided as a set of predetermined time values and corresponding optimal prime mover speed values, and varying the instantaneous speed of the prime mover further comprises applying the corresponding optimal prime mover speed value to the controller at each said time value within the stroke cycle.

18. The method of any one of claim 1, 5, or 9, wherein the set of optimal prime mover speed values is provided as a set of predetermined stroke positions and corresponding optimal prime mover speed values, and varying the instantaneous speed of the prime mover further comprises applying the corresponding optimal prime mover speed value to the controller at each said stroke position within the stroke cycle.

19. The method of any one of claim 1, 5, or 9, wherein the stroke position comprises either a polished rod position or a position of another moving component equivalent to a position of the polished rod within the entire stroke cycle.

20. The method of any one of claim 1, 5, or 9, further comprising, after varying the instantaneous speed of the prime mover by applying the set of optimal prime mover speed values for the entire stroke cycle to the controller:
- measuring physical conditions of the pumping system during operation;
- adjusting parameters of the model of the pumping system based on a comparison of said model with the measured physical conditions;
- generating a new set of optimal prime mover speed values using the model of the pumping system with the adjusted parameters; and
- applying the new set of optimal prime mover speed values to the controller.

21. The method of claim 20, wherein the physical conditions comprise a stroke position and at least one of:
- a polished rod load;
- the prime mover torque or force; or
- prime mover power usage.

22. The method of claim 21, wherein at least a portion of the rod string operates inside a tubing filled with a fluid and wherein the physical conditions further comprise at least one of:
- pressure in the tubing;
- pressure in a well casing; or
- the output production rate.

23. Code stored on a non-transitory computer-readable medium which, when executed by at least one processor of a computing device, causes the computing device to carry out the method of any one of claim 1, 5, or 9.

* * * * *